US005284091A

United States Patent [19]

Kon et al.

[11] Patent Number: 5,284,091

[45] Date of Patent: Feb. 8, 1994

[54] PLATE ROLL AND AN ADHESIVE SHEET THEREFOR

[75] Inventors: Kazuhiro Kon, Kawaguchi; Koichi Hirota, Tokyo; Masao Kogure, Fukiage; Takanori Saito, Misato, all of Japan

[73] Assignee: Lintec Corporation, Tokyo, Japan

[21] Appl. No.: 884,270

[22] Filed: May 8, 1992

Related U.S. Application Data

[63] Continuation-in-part of Ser. No. 681,871, Apr. 5, 1991, abandoned.

[30] Foreign Application Priority Data

Apr. 12, 1990 [JP] Japan .................................... 2-96833

[51] Int. Cl.$^5$ ........................ B41F 13/10; H01L 21/68

[52] U.S. Cl. ................................ 101/378; 101/415.1; 428/40; 428/343; 428/345; 428/350; 428/354; 428/355; 428/356; 428/457; 428/461; 428/463; 428/913

[58] Field of Search ................ 428/40, 343, 345, 350, 428/354, 355, 356, 913, 457, 461, 463; 427/208; 101/415.1, 395, 378, 382.1, 383; 430/271, 306; 492/18

[56] References Cited

U.S. PATENT DOCUMENTS

| | | | |
|---|---|---|---|
| 4,097,350 | 6/1978 | Pastor | 428/442 |
| 4,331,576 | 5/1982 | Colon | 428/913 |
| 4,355,074 | 10/1982 | Stemmler | 428/40 |
| 4,444,839 | 4/1984 | Dudzik | 428/350 |
| 4,672,080 | 6/1987 | Masaoka | 522/46 |
| 4,839,206 | 6/1989 | Waldenberger | 428/40 |
| 4,871,631 | 10/1989 | Pieper et al. | 430/14 |
| 4,895,747 | 1/1990 | Birkholz | 428/350 |
| 4,913,960 | 4/1990 | Kuroda | 428/913 |
| 5,104,719 | 4/1992 | Kamen | 428/40 |

FOREIGN PATENT DOCUMENTS

| | | | |
|---|---|---|---|
| 497280 | 10/1970 | European Pat. Off. . | |
| 157508 | 10/1985 | European Pat. Off. . | |
| 70077 | 6/1981 | Japan . | |
| 157162 | 9/1984 | Japan . | |
| 1-61080 | 6/1989 | Japan | 428/350 |

OTHER PUBLICATIONS

Patent Abstracts of Japan, vol. 13, No. 519 (M-895) (3867) Nov. 20, 1989 & JP-A-1 210343, Aug. 1989.

Patent Abstracts of Japan, vol. 9, No. 1 (C-259), Jan. 5, 1989, & JP-A-59 157 162, Sep. 6, 1984.

Patent Abstracts of Japan, vol. 10, No. 364 (P-524) (2421), Dec. 5, 1986 & JP-A-61 160 749, Jul. 21 1986.

*Primary Examiner*—Ellis P. Robinson
*Assistant Examiner*—Nasser Ahmad
*Attorney, Agent, or Firm*—Frishauf, Holtz, Goodman & Woodward

[57] ABSTRACT

A plate roll attached by an adhesive sheet to a printing plate made of a resin. The attached printing plate is easily detached. The adhesive sheet and remaining adhesive are easily removed after printing is finished and the efficiency of the operation of printing is enhanced. The adhesive sheet includes a photocurable adhesive, which loses adhesive ability by curing by irradiation of electromagnetic waves or an electron beam or a water swelling adhesive, which loses adhesive ability by swelling by water. Adhesive sheets for the plate roll comprise supporting sheets, removable sheets and a photocurable adhesive, which loses adhesive ability by curing by irradiation of electromagnetic waves or an electron beam or a water swelling adhesive, which loses adhesive ability by swelling by water.

19 Claims, No Drawings

PLATE ROLL AND AN ADHESIVE SHEET THEREFOR

This application is a continuation-in-part of application Ser. No. 07/681,871, filed Apr. 5, 1991 is now abandoned.

BACKGROUND OF THE INVENTION

1. Field of the Invention

The present invention relates to a novel plate roll attached with a printing plate made of resin by means of adhesive and a novel adhesive sheet utilized for attaching the printing plate to the base plate roll.

2. Prior Art

A printing plate leaf made of resin is attached to a base plate roll to form a plate roll by means of a double faced adhesive sheet and continuous printing is made by rotating the plate roll.

Adhesives generally utilized for attaching the printing plate leaf to the base plate roll have strong adhesive ability and the printing plate leaf is not easily detached from the base plate roll after the printing is finished. Occasionally, the printing plate leaf made of resin is torn up during the operation of detaching. A part of the adhesive and the adhesive sheet usually remains on the surface of the base plate roll or the printing plate and removal of the remaining things takes time.

SUMMARY OF THE INVENTION

The present invention accordingly has an object to provide a plate roll in which a printing plate is firmly attached during the printing operation, the printing plate is easily detached from the base plate roll after the printing operation is finished and remaining adhesive is easily removed. Another object of the invention is to provide an adhesive sheet utilized for the plate roll.

Thus, the plate roll attached with a printing plate made of resin by means of an adhesive of the present invention is characterized in that a photocurable adhesive which loses adhesive ability by curing by irradiation of electromagnetic waves or an electron beam is used as the adhesive.

The plate roll attached with a printing plate made of resin by means of an adhesive of the invention is also characterized in that a water swelling adhesive which loses adhesive ability by swelling by water is used as the adhesive.

The adhesive sheet utilized for attaching a printing plate made of resin to a base plate roll of the invention is characterized in that the adhesive sheet comprises a removable sheet and a photocurable adhesive which loses adhesive ability by curing by irradiation of electromagnetic waves or an electron beam and is coated on one face of the removable sheet.

The adhesive sheet utilized for attaching a printing plate made of resin to a base plate roll of the invention is also characterized in that the adhesive sheet comprises a supporting sheet, a removable sheet and adhesive layers coated on both faces of the supporting sheet, that the adhesive layer coated at least on one face of the supporting sheet comprises a photocurable adhesive which loses adhesive ability by curing by irradiation of electromagnetic waves or an electron beam and that the removable sheet is attached at least on one face of the adhesive sheet.

The adhesive sheet utilized for attaching a printing plate made of resin to a base plate roll of the invention is also characterized in that the adhesive sheet comprises a removable sheet and a water swelling adhesive which loses adhesive ability by swelling by water and is coated on one face of the removable sheet.

The adhesive sheet utilized for attaching a printing plate made of resin to a base plate roll of the invention is also characterized in that the adhesive sheet comprises a supporting sheet, a removable sheet and adhesive layers coated on both faces of the supporting sheet, that the adhesive layer coated at least on one face of the supporting sheet comprises a water swelling adhesive which loses adhesive ability by swelling by water and that the removable sheet is attached at least on one face of the adhesive sheet.

The adhesive sheet utilized for attaching a printing plate made of resin to a base plate roll of the invention is also characterized in that the adhesive sheet comprises a supporting sheet, a removable sheet and adhesive layers coated on both faces of the supporting sheet, that the adhesive layer coated on one face of the supporting sheet comprises a photocurable adhesive which loses adhesive ability by curing by irradiation of electromagnetic waves or an electron beam, that the adhesive layer coated on the other face of the supporting sheet comprises a water swelling adhesive which loses adhesive ability by swelling by water and that the removable sheet is attached at least on one face of the adhesive sheet.

Other and further objects, features and advantages of the invention will appear more fully from the following description.

DETAILED DESCRIPTION OF THE PREFERRED EMBODIMENTS

It was considered by the present inventors that the antinomic problem that a printing plate is firmly attached to base plate roll during the printing operation and easily detached after the printing operation is finished can be solved only by changing the adhesive ability of the adhesive utilized between the time of attachment and the time of detachment. For the purpose of changing the adhesive ability of the adhesive utilized, a mechanism of decreasing the adhesive ability by curing the adhesive by the action of electromagnetic wave and another mechanism of decreasing the adhesive ability by swelling the adhesive by water were considered. These considerations led to the completion of the present invention.

The present invention as a whole comprises the following seven embodiments:

Embodiments 1: A plate roll attached with a printing plate made of resin by means of an adhesive which is characterized in that a photocurable adhesive which loses adhesive ability by curing by irradiation of electromagnetic waves or an electron beam is used as the adhesive.

Embodiment 2: A plate roll attached with a printing plate made of resin by means of an adhesive which is characterized in that a water swelling adhesive which loses adhesive ability by swelling by water is used as the adhesive.

Embodiment 3: An adhesive sheet utilized for attaching a printing plate made of resin to a base plate roll which is characterized in that the adhesive sheet comprises a removable sheet and a photocurable adhesive which loses adhesive ability by curing by irradiation of electromagnetic waves or an electron beam and is coated on one face of the removable sheet.

Embodiment 4: An adhesive sheet utilized for attaching a printing plate made of resin to a base plate roll which is characterized in that the adhesive sheet comprises a supporting sheet, a removable sheet and adhesive layers coated on both faces of the supporting sheet, that the adhesive layer coated at least on one face of the supporting sheet comprises a photocurable adhesive which loses adhesive ability by curing by irradiation of electromagnetic waves or an electron beam and that the removable sheet is attached at least on one face of the adhesive sheet.

Embodiment 5: An adhesive sheet utilized for attaching a printing plate made of resin to a base plate roll which is characterized in that the adhesive sheet comprises a removable sheet and a water swelling adhesive which loses adhesive ability by swelling by water and is coated on one face of the removable sheet.

Embodiment 6: An adhesive sheet utilized for attaching a printing plate made of resin to a base plate roll which is characterized in that the adhesive sheet comprises a supporting sheet, a removable sheet and adhesive layers coated on both faces of the supporting sheet, that the adhesive layer coated at least on one face of the supporting sheet comprises a water swelling adhesive which loses adhesive ability by swelling by water and that the removable sheet is attached at least on one face of the adhesive sheet.

Embodiment 7: An adhesive sheet utilized for attaching a printing plate made of resin to a base plate roll which is characterized in that the adhesive sheet comprises a supporting sheet, a removable sheet and adhesive layers coated on both faces of the supporting sheet, that the adhesive layer coated on one face of the supporting sheet comprises a photocurable adhesive which loses adhesive ability by curing by irradiation of electromagnetic waves or an electron beam, that the adhesive layer coated on the other face of the supporting sheet comprises a water swelling adhesive which loses adhesive ability by swelling by water and that the removable sheet is attached at least on one face of the adhesive sheet.

The kind of the printing plate made of resin and the base plate roll utilized in the invention is not particularly limited but any kind may be utilized.

The adhesive utilized in the embodiment 1 is not particularly limited so long as the adhesive loses its adhesive ability by irradiation of electromagnetic waves, such as ultraviolet light, visible light, γ-ray, X-ray infrared light and the like, or an electron beam. When electromagnetic waves having weaker penetrating power through substances, such as ultraviolet light, visible light and infrared light, is utilized, the printing plate made of resin is desirably more transparent.

The total dose irradiated is generally more than 15 $mJ/cm^2$. The irradiation strength is generally more than 5 $mW/cm^2$. The preferred mode of irradiation is irradiation by a wave having a wave length of near to 365 nm.

The loss of adhesive ability in the invention means a remarkable decrease of adhesive strength. It is the condition that the adhesive strength is so lower than the original strength that the printing plate can be detached easily by one's hands.

The original adhesive strength of the photocurable adhesive prior to photocuring is generally more than 300 g/inch, preferably from 500 to 2500 g/inch, more preferably from 500 to 2000 g/inch. The degree of the loss of adhesive ability after photocuring is generally not more than 200 g/inch, preferably not more than 100 g/inch, more preferably not more than 50 g/inch.

Examples of the photo curable adhesives of the invention are: (1) an adhesive comprising a polymer having two or more photo reactive unsaturated bonds as the main component of the adhesive and (2) an adhesive which is prepared by compounding a photo sensitive monomer and like other reactive low molecular weight compounds into a conventional adhesive.

The photocurable adhesive (2) is preferably included in the present invention. The photocurable adhesive (2) is able to control adhesive strength over a very wide scope, because of the selection of various adhesive polymers.

Examples of the photocurable adhesive (1) are: a polymer prepared by reacting glycidyl (meth)acrylate with acid groups in copolymer of acrylic ester of methacrylic ester and a small amount of acrylic acid or methacrylic acid; and a polymer prepared by reacting half-urethane with a mixture of β-hydroxyethyl (meth)acrylate having a hydroxyl group in the molecule with a copolymer of acrylic ester of methacrylic ester and a small amount of acrylic acid or methacrylic acid. The half-urethane is prepared by the reaction of polyisocyanate with a monomer containing hydroxyl group. Photoreactive groups are introduced into the polymer by these reactions.

Examples of the photocurable adhesive (2) are: a compound prepared by mixing a photosensitive monomer with conventional rubber or acrylic adhesive in the amount from 1 to 80% by weight, preferably from 35 to 70% by weight, more preferably 40 to 60% by weight.

Examples of the conventional rubber or the acrylic adhesive are rubber adhesives comprising natural rubber or synthetic rubber such as SBR and a tackifier resin such as terpene and rosin, and polyacrylic adhesives comprising mainly a 2-ethylhexylacrylate unit or an n-butylacrylate unit. The preferred examples of a conventional rubber adhesive is an adhesive comprising 30 to 70% by weight of natural rubber and 70 to 30% by weight of rosin resin. The preferably example of a rosin resin is a rosin resin having a softening point of 90° C. to 110° C. The preferred example of a polyacrylic adhesive is a copolymer comprising 80 to 95% by weight of an n-butylacrylate unit and 20 to 5% by weight of an acrylic acid unit.

Examples of the photo sensitive monomer are: (meth-)acrylic esters having two or more double bonds in the molecule, such as 1,4-butylene glycol diacrylate, 1,6-hexane glycol diacrylate, neopentyl glycol diacrylate, (poly)ethylene glycol diacrylate, trimethylolpropane tri(meth)acrylate, tetramethylolmethane tetracrylate, pentaerythritol triacrylate, pentaerythritol tetraacrylate, dipentaerythritol monohydroxypentaacrylate, dipentaerythritol hexaacrylate and the like.

The preferable example is urethane acrylate oligomer. The urethane acrylate oligomer is produced by reacting a urethane prepolymer having terminal isocyanate functional groups and hydroxy acrylate or hydroxy methacrylate, such as 2-hydroxyethyl acrylate, 2-hydroxyethyl methacrylate, 2-hydroxypropyl acrylate, 2-hydroxypropyl methacrylate, polyethyleneglycol acrylate and polyethyleneglycol methacrylate. The urethane prepolymer having terminal isocyanate functional groups is produced by reacting a polyol such as polyesterpolyol and polyetherpolyol, and a polyisocyanate compound such as 2,4-tolylenediisoxyanate, 2,6-tolylenediisocyanate, 1,3-xylylenediisocyanate, 1,4-xylylenediisocyanate and diphenylmethane 4,4'-diisocyanate. The urethane acrylic oligomer is a radiation polymerizable compound having at least one carbon -carbon double bond.

It is desirable that a photosensitizer is added to the photo curable adhesive to enhance the reaction rate of curing. Examples of such photosensitizers are: diacetyl, benzil, benzophenone, benzoin, bromoacetophenone, chloroacetone, benzoquinone, anthraquinone, 2-ethylanthraquinone, benzoin isopropyl ether, benzoin ethyl ether and the like other organic carbonyl compounds. The photo sensitizer is generally utilized in the amount from 0.1 to 10 weight %, preferably from 1 to 5 weight %, of the adhesive.

After printing is finished, the plate roll of the embodiment 1 is irradiated by electromagnetic waves or an electron beam from the surface of the printing plate made of resin attached on the base plate roll. Because the adhesive between the printing plate and the base plate roll is cured by the irradiation, the adhesive ability of the adhesive is lost and the printing plate made of resin is easily detached from the base plate roll.

The source of the irradiation is not particularly limited so long as the irradiation cures the adhesive and can be appropriately selected according to the adhesive utilized. Ultraviolet light is preferable because of efficiency of the irradiation time and simplicity of apparatus.

The kind of the water swelling adhesive of the embodiment 2 is not particularly limited so long as the adhesive loses adhesive ability by swelling with water.

The original adhesive strength of the water swelling adhesive is generally more than 300 g/inch, preferably from 300 to 1500 g/inch, more preferably from 30 to 700 g/inch. The degree of the loss of adhesive ability after swelling is generally not more than 200 g/inch, preferably not more than 100 g/inch, more preferably not more 50 g/inch. The degree of swelling of the adhesive is generally more than 1.2 times when the adhesive strength is not more than 200 g/inch, more than 1.7 times when the adhesive strength is not more than 100 g/inch and more than 2 times when the adhesive strength is not more than 50 g/inch.

An example of the water swelling adhesive is an adhesive described in Japanese Patent Publication Showa 49-23294 which is described in the following.

The adhesive comprises (A) one or more than one kinds of an nonionic surface active agent which comprises an ethylene oxide group as the hydrophillic group and (B) one or more than one kinds of a copolymer composed of 40 to 99 mole % of one or more than one kinds of a constituent unit having the formula (I) and 60 to 1 mole % of one or more than one kinds of a constituent unit having the formula (II) and, optionally according to the needs, carboxyl groups comprised in the component (B) are crosslinked by a crosslinking agent reacting with a carboxyl group, such as zinc acetate and magnesium chloride;

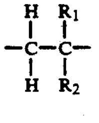

(I)

wherein $R_1$ is hydrogen, chlorine or a lower alkyl group, $R_2$ is hydrogen, chlorine, a lower alkyl group, $—OCOR_3$, $—OR_3$, $—COOR_3$, phenyl, tolyl, —CN, $—CONH_2$, $—CONHCH_2OH$, $—CH_2OH$, $—C_2H_4OH$, —OH or pyridyl and $R_3$ is an alkyl group of 1 to 8 carbon atoms;

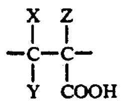

(II)

wherein X, Y and Z may be the same kind or different kinds selected from hydrogen, chlorine, a lower alkyl group, $—COOR_4$, —COOH, $—CH_2COOH$ or $—CH_2COOR_4$ and $R_4$ is an alkyl group of 1 to 4 carbon atoms. Alkaline compounds, such as potassium hydroxide, may be added when the adhesive is crosslinked by the crosslinking agent Examples of the nonionic surface active agent which comprises ethylene oxide group as the hydrophillic group of the component (A) are:

(1) $OH(C_2H_4O)_a(C_3H_6O)_b(C_2H_4O)_cH$, wherein a, b and c are integers from 20 to 80;

(2) $RA(C_2H_4O)_dH$, wherein R is an alkyl group of 6 to 18 carbon atoms, an alkylphenyl group having an alkyl group of 4 to 20 carbon atoms or a group having the formula (III)

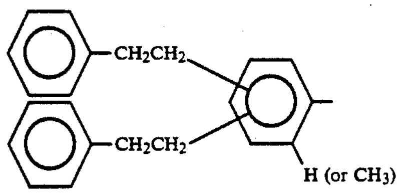

(III)

wherein A is oxygen, sulfur or —COO—, —CONH—, $—CON(C_2H_4O)_4H—$, $—PO_4H—$ or $—PO_4(C_2H_4O)_4H—$ and d is an integer from 2 to 80; and (3)

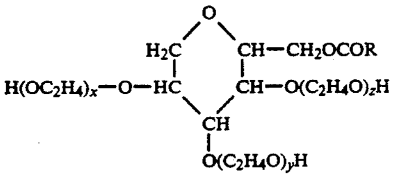

(IV)

wherein R is an alkyl group of 6 to 18 carbon atoms and x, y and z are integers of 2 to 40.

Preferable examples of the nonionic surface active agent which comprises ethylene oxide group as the hydrophillic group of the component (A) are: polyethylene glycol nonylphenyl ether, polyethylene glycol sorbitane monooleyl ester, polyethylene glycol lauryl ether, block copolymer of polyethylene glycol and polypropylene glycol, polyethylene glycol lauryl phenyl ether, polyethylene glycol t-butyl phenyl ether and the like.

The constituent unit having the formula (I) of the component (B) is introduced by using a monomer, such as vinyl esters like vinyl acetate, methacrylic esters like ethyl acrylate, ethylene, styrene, methyl vinyl ether, vinyl chloride and acrylonitrile. The constituent unit having the formula (II) of the component (B) is introduced by using a monomer having a carboxyl group, such as acrylic acid, methacrylic acid, crotonic acid, itaconic acid, maleic acid, fumaric acid, aconotic acid, monoalkyl maleic acid, monoalkyl fumaric acid, monoalkyl itaconic acid and the like.

It is required that the component (A) and the component (B) are compatible and the adhesive prepared swells with water and, therefore, that the ratio of the component (A) and the component (B) is within a definite range as described in the cited reference.

Epoxy compounds of glycidyl derivative may be optionally utilized with the component (A) and the component (B).

Another example of the water swelling adhesive is an adhesive described in Laid Open japanese Patent Publication Showa 59-157162 which is described in the following.

The adhesive comprises (A) a water soluble polymer and (B) (meth)acrylic ester monomer which gives a water soluble or a water swelling polymer by polymerization.

An example of the water soluble polymer of the component (A) is a polymer prepared from a monomer having the following formula (V):

$$CH_2{=}CR_5{-}\overset{O}{\overset{\|}{C}}{+}O{-}R_6{)_n}O{-}R_7 \quad (V)$$

wherein $R_5$ is hydrogen or a methyl group, $R_6$ is an alkylene group of 2 to 4 carbon atoms, $R_7$ is an alkyl group of 1 or more than 1 carbon atoms and n is an integer of 1 or more than 1, such as (meth)acrylic ester, acrylic acid, vinylpyrrolidone, acrylamide, dimethylaminoethyl (meth)acrylate, diethylaminoethyl (meth)acrylate, vinyl methyl ether and the like. A water souble polymer prepared by copolymerizing 30 weight part or less of acrylic ester, vinyl acetate, styrene and the like monomer with 100 weight parts of the monomer having the formula (V) may be optionally utilized as the water soluble polymer of the component (A).

Examples of (meth)acrylic ester monomer of the component (B) are: (meth)acrylic ester, dimethylaminoethyl (meth)acrylate, diethylaminoethyl (meth)acrylate and the like.

Still another example of the water swelling adhesive is the adhesive described in Laid-Open Japanese Patent Publication Showa 56-70077 which is described in the following.

The adhesive comprises (A) a salt of a copolymer prepared by neutralizing carboxylic acid in a copolymer comprising 10 to 40 mole % of a monomer having a carboxyl group, 60 to 90 mole % of alkyl (meth)acrylate in which the alkyl group has 4 or more carbon atoms and 0 to 20 mole % of another vinyl monomer and (B) a hydrophillic compound having the formula: $R_8O(R_9O)_mR_{10}$, wherein $R_8$ is an alkyl group of 1 to 4 carbon atoms, $R_9$ is an alkylene group of 2 to 4 carbon toms, $R_{10}$ is hydrogen or an alkyl group or an acetyl group of 1 to 4 carbon atoms and m is an integer of 1 to 6.

When the printing operation using the plate roll of the embodiment 2 is finished and the printing plate made of resin attached to the base plate roll is detached, water is added to the adhesive sheet remaining on the face of the base plate roll or the printing plate. The adhesive sheet is swelled by water and the adhesive ability of the adhesive sheet is lost. The adhesive sheet and adhesive layer are removed completely with ease.

The adhesive sheet of the embodiment 3 is the adhesive sheet utilized for the plate roll of embodiment 1. The adhesive sheet comprises a layer of the photocurable adhesive and a removable sheet on one or both faces of the adhesive layer.

The adhesive sheet comprising a layer of the photo curable adhesive and a removable sheet only on one face of the adhesive layer can be stored in the form of roll. It is desirable that the faces of the removable sheet have such characteristics that a face of the removable sheet is more easily removed from the adhesive than the other face of the removable sheet.

When the ease of removal of the adhesive from the removable sheet is different between the two faces of the removable sheet, the problem that the adhesive coated originally on one face of the removable sheet is separated on the both faces of the removable sheet in the roll can be surely prevented during the operation. When the adhesive sheet is utilized, it is pulled out from the roll, the adhesive face of the adhesive sheet is pressed to the outer face of the base plate roll or to the inner face of the printing plate and the removable sheet is removed from the adhesive. The printing plate is attached to the base plate roll by pressing it against the base plate roll and the plate roll is prepared.

When the adhesive sheet comprises a layer of the photo curable adhesive and a removable sheet on both faces of the adhesive layer, it is desirable that the removable sheet at one face of the adhesive layer is more easily detached from the adhesive than the removable sheet at the other face of the adhesive layer by the same reason as described. When the adhesive sheet is utilized, the removable sheet which can be removed from the adhesive more easily is first removed from the adhesive sheet and the adhesive sheet is pressed to the outer face of the base plate roll or to the inner face of the printing plate and the remaining removable sheet is removed from the adhesive. The printing plate is attached to the base plate roll by pressing it against the plate roll and the plate roll is prepared.

When the operation of printing is finished by using the adhesive sheet of embodiment 3, the plate roll attached with the printing plate made of resin is irradiated by, for example, ultraviolet light for 20 to 30 seconds from the surface of the printing plate made of resin. The photo curable adhesive on the inner face of the printing plate is cured by the irradiation and loses adhesive ability. Thus, the printing plate is easily detached from the plate roll by hand. Remaining adhesive on the faces are removed easily.

The adhesive sheet of the embodiment 4 comprises a supporting sheet and two layers of adhesive coated on both faces of the supporting sheet and at least one of the two layers of adhesive comprises the photo curable adhesive. The adhesive sheet can be stored by attaching a removable sheet on one or both faces of the adhesive sheet.

The supporting sheet is not particularly limited. Examples of the supporting sheet are films of polyethylene terephthalate, nylon, polypropylene, polycarbonate and the like other materials. When ultraviolet light, visible light and infrared light are utilized for irradiation, films having higher transparency is preferable so that the light transmission is easier.

It is also preferable that the surface of the supporting sheet is activated by corona discharge or by like other methods to enhance the affinity of the adhesive and the surface.

When the adhesive sheet of the embodiment 4 having a removable sheet on one face of the sheet is utilized, the adhesive sheet is attached to the outer face of the plate roll or to the inner face of the printing roll by the face on which the adhesive is exposed. The removable sheet is removed and the printing plate is attached to the base plate roll by pressing to the base plate roll. It is desirable that the adhesive layer of photo curable adhesive is placed to the face of the base plate roll.

When the printing plate is attached to the base plate roll by utilizing the adhesive sheet of the embodiment 4 having photo curable adhesive on one face and conventional adhesive on the other face and the adhesive layer of the photo curable adhesive is placed to the face of the base plate roll, the adhesive on the surface of the base plate roll is cured by irradiation of ultraviolet light and the printing plate can be detached from the base plate roll while the adhesive sheet is still attached to the printing plate.

Printing plates made of resin are often disposed after the use. The adhesive sheet of the embodiment 4 having photo curable sheet only on one face is suitable for easy disposal because the adhesive sheet need not be removed.

When a printing plate made of resin is used again after it is utilized for printing, the adhesive sheet of the embodiment 4 having photocurable adhesive on the both faces is suitable for use.

The adhesive sheet of the embodiment 5 is utilized for the plate roll of the embodiment 2 and comprises a layer of water swelling adhesive and a removable sheet attached on one or both faces of the layer of the adhesive.

When the removable sheet is attached only on one face of the adhesive layer, the adhesive sheet can be stored in the form of roll. It is desirable that the faces of the removable sheet have such characteristics that a face of the removable sheet is more easily removed from the adhesive than the other face of the removable sheet.

When the ease of removal of the adhesive from the removable sheet is different between the two faces of the removable sheet, the problem that the adhesive coated originally on one face of the removable sheet is separated on the both faces of the removable sheet in the roll can be surely prevented during the operation. When the adhesive sheet is utilized, it is pulled out from the roll, the adhesive face of the adhesive sheet is pressed to the outer face of the base plate roll or to the inner face of the printing plate and the removable sheet is removed from the adhesive. The printing plate is attached to the base plate roll by pressing it against the base plate roll and the plate roll is prepared.

When the adhesive sheet comprises a layer of the water swelling adhesive and a removable sheet on both faces of the adhesive layer, it is desirable that the removable sheet at one face of the adhesive layer is more easily detached from the adhesive than the removable sheet at the other face of the adhesive layer by the same reason as described. When the adhesive sheet is utilized, the removable sheet which can be removed from the adhesive more easily is first removed from the adhesive sheet and the adhesive sheet is pressed to the outer face of the base plate roll or to the inner face of the printing plate and the remaining removable sheet is removed from the adhesive. The printing plate is attached to the base plate roll by pressing it against the plate roll and the plate roll is prepared.

When the operation of printing is finished by using the adhesive sheet of the embodiment 5, the printing plate made of resin is detached from the base plate roll by using a conventional method. Adhesive remaining on the surfaces of the base plate roll and printing plate made of resin is treated with water. The adhesive is swelled by water and loses adhesive ability and can be removed very easily by wiping with cloth or the like.

The adhesive sheet of the embodiment 6 comprises a supporting sheet and two water swelling adhesive layers coated on both faces of the supporting sheet. As the supporting sheet, a porous sheet is preferred because water penetrates easily in the sheet.

The preferable porous sheet has a density of 0.7 to 0.8 $g/cm^3$ and a thickness of 20 to 100 $\mu m$. The preferable example of the porous sheet is a continuous porous sheet made of urethane resin, polyvinylchloride resin and the line.

When the adhesive sheet of the embodiment 4 having the photo curable adhesive only on one face is coated with the water swelling adhesive on the other face, the adhesive sheet formed corresponds to the adhesive sheet of the embodiment 7. The plate roll is prepared by utilizing the adhesive sheet in the same way as in the embodiment 4.

The plate roll attached with the printing plate by utilizing the adhesive sheet of the embodiment 7 through the photocurable adhesive on the outer face of the base plate roll and the water swelling adhesive on the inner face of the printing plate is, after finishing the operation of printing, irradiated with ultraviolet light and the printing plate is removed from the face of the base plate roll while the adhesive sheet is still attached to the printing plate.

When the printing plate is dipped into water, the adhesive is swelled and the adhesive sheet is removed spontaneously from the printing plate. The remaining printing plate can be utilized again after drying.

When the base plate roll is attached with the printing plate through the water swelling adhesive on the outer face of the base plate roll and the photocurable adhesive on the inner face of the printing plate, the printing sheet remains on the surface of the base plate roll and can be removed by swelling with water.

The former method is preferable because the printing plate is quickly detached from the base plate roll.

The invention will be understood more readily with reference to the following examples; however these examples are intended to illustrate the invention and are not to be construed to limit the scope of the invention.

EXAMPLE 1

Polyethylene terephthalate film of 50$\mu$ thickness activated by corona discharge on both faces was used as the supporting sheet for a double faced tape.

A removable sheet of polyethylene terephthalate film of 38$\mu$ thickness coated with silicone on one face was coated with a photo curable adhesive to 15$\mu$ thickness by a knife coater on the face coated with silicone. The adhesive was an acrylic adhesive comprising 40 weight % of trimethylolpropane (meth)acrylate and 5 weight % of benzoin was further added as the photosensitizer.

The removable sheet coated with the photocurable adhesive was laminated to the both faces of the supporting sheet and a double face adhesive sheet was prepared.

One of the removable sheets on the adhesive sheet was removed and the adhesive sheet was pressed to a printing plate made of resin (Torayleaf®, a product of Toray Co., Ltd., a printing plate made of a photosensitive nylon resin, 1 mm thickness). The other removable sheet was removed and the printing plate was attached to a stainless steel base plate roll by using the double face adhesive sheet.

After standing for 24 hours, the plate roll was irradiated with ultraviolet light by a 35 $mW/cm^2$ ultraviolet lamp for 20 seconds over the printing plate made of a resin. Total dose of ultraviolet light irradiated was 700 $mJ/cm^2$.

After the irradiation, the printing plate made of resin was easily detached by one's fingers. The adhesive sheet remained attached to the face of the printing plate when the printing plate was detached from the base plate roll and was removed from the printing plate easily by one's fingers.

The same adhesive sheet as the above was laminated to the same printing plate as the above and used for an adhesion test without attaching to the base plate roll. After standing for 24 hours, the adhesive strength was 1700 g/25 mm width. Then, ultraviolet light was irradiated to the outer face of the printing plate made of resin in the same condition as the above. Ten minutes after the irradiation, the adhesive strength decreased to 90 g/25 mm width.

EXAMPLE 2

A removable sheet coated to the thickness of 50μ with an acrylic water swelling adhesive which comprised a copolymer of ethyl acrylate, vinyl acetate and methacrylic acid and polyethylene glycol lauryl ether and was crosslinked by zinc acetate in the presence of potassium hydroxide was utilized in place of one of the two removable sheets coated with adhesive utilized in Example 1. A porous having a density of 7.5 $g/cm^3$ and a thickness of 50 μm sheet of polyethylene terephthalate treated by corona discharge was utilized as the supporting sheet. A printing plate was attached to a base plate roll by the same method as in Example 1.

After standing for 24 hours, ultraviolet light was irradiated by the same method as in Example 1. The printing plate was detached from the base plate roll easily by one's fingers.

When the printing plate was detached from the base plate roll, the adhesive sheet was firmly attached to the inner face of the printing plate. After dipping the printing plate in water for 3 hours, the adhesive sheet was removed from the printing plate easily by one's fingers.

While the invention has been particularly shown and described with reference to preferred embodiments thereof, it will be understood by those skilled in the art that the foregoing and other changes in form and details can be made therein without departing from the spirit and scope of the invention.

To summarize the advantages obtained by the invention, the plate roll attached with the printing plate made of resin according to the invention has advantages that the printing plate attached is easily detached, the adhesive sheet and remaining adhesive are easily removed after the operation of printing is finished and thus efficiency of the operation of printing is enhanced.

What is claimed is:

1. A plate roll attached to a printing plate comprising a printing plate made of a resin which is transparent to electromagnetic waves and which is attached to a plate roll by a photocurable adhesive which loses its adhesive ability by curing by irradiation with electromagnetic waves.

2. A plate roll attached to a printing plate comprising a printing plate made of a resin which is transparent to electromagnetic waves, said printing plate being attached to a base plate roll by an adhesive sheet comprising a removable sheet which is coated on one face thereof with a photocurable adhesive which loses its adhesive ability by curing by irradiation with electromagnetic waves, the removable sheet being removed before the printing plate is attached to the base plate.

3. A plate roll attached to a printing plate comprising a printing plate made of a resin transparent to electromagnetic waves, said printing plate being which is attached to a base plate roll by an adhesive sheet which has opposing faces and comprises a supporting sheet having opposing faces, a removable sheet disposed on at least one face of the adhesive sheet, a first adhesive layer coated on one face of the supporting sheet, and a second adhesive layer coated on the other face of the supporting sheet, at least one of the first adhesive layer and the second adhesive layer comprises a photocurable adhesive which loses its adhesive ability by curing by irradiation with electromagnetic waves, the removable sheet being removed before the printing plate is attached to the base plate.

4. An adhesive sheet for attaching a printing plate made of a resin to a base plate roll, wherein the adhesive sheet has opposing faces and comprises a supporting sheet having opposing faces, the removable sheet and adhesive layers coated on both faces of the supporting sheet, the adhesive layer coated on one face of the supporting sheet comprises a photocurable adhesive which loses adhesive ability by curing by irradiation of electromagnetic waves or an electron beam, the adhesive layer coated on the other face of the supporting sheet comprises a water swelling adhesive which loses adhesive ability by swelling by water and the removable sheet is attached on at least one face of the adhesive sheet.

5. The plate roll attached to a printing plate according to claim 2, wherein the photocurable adhesive is an adhesive prepared by compounding a photosensitive low molecular weight compound into a conventional adhesive.

6. The plate roll attached to a printing plate according to claim 5, wherein the amount of the photosensitive low molecular weight compound is 1 to 80% by weight.

7. The plate roll attached to a printing plate according to claim 5, wherein the amount of the photosensitive low molecular weight compound is 35 to 70% by weight.

8. The plate roll attached to a printing plate according to claim 5, wherein the amount of the photosensitive low molecular weight compound is 40 to 60% by weight.

9. The plate roll attached to a printing plate according to claim 5, wherein the conventional adhesive is a rubber adhesive comprising rubber and a tackifier resin of terpene or rosin, or polyacrylic adhesive comprising mainly 2-ethylhexylacrylate units or n-butylacrylate units.

10. The plate roll attached to a printing plate according to claim 5, wherein the conventional adhesive comprises 30 to 70% by weight of natural rubber and 70 to 30% by weight of rosin resin.

11. The plate roll attached to a printing plate according to claim 5, wherein the conventional adhesive comprises a copolymer comprising 80 to 95% by weight of n-butylacrylate units and 20 to 5% by weight of acrylic acid units.

12. The plate roll attached to a printing plate according to claim 2, wherein the photocurable adhesive has an adhesive strength of more than 300 g/inch prior to photocuring and the degree of loss of adhesive ability after photocuring is not more than 200 g/inch.

13. The plate roll attached to a printing plate according to claim 2, wherein the photocurable adhesive has an adhesive strength of 500 to 2500 g/inch prior to photocuring and the degree of loss of adhesive ability after photocuring is not more than 100 g/inch.

14. The plate roll attached to a printing plate according to claim 2, wherein the photocurable adhesive has an adhesive strength of 500 to 2000 g/inch prior to photocuring and the degree of loss of adhesive ability after photocuring is not more than 50 g/inch.

15. The plate roll attached to a printing plate according to claim 1, wherein the electromagnetic waves are selected from the group consisting of ultraviolet light, visible light, γ-rays, X-rays and infrared light.

16. The plate roll attached to a printing plate according to claim 1, wherein the photocurable adhesive has an adhesive strength of more than 300 g/inch prior to photocuring and the degree of loss of adhesive ability after photocuring is not more than 200 g/inch.

17. The plate roll attached to a printing plate according to claim 1, wherein the photocurable adhesive has an adhesive strength of 500 to 2500 g/inch prior to photocuring and the degree of loss of adhesive ability after photocuring is not more than 100 g/inch.

18. The plate roll attached to a printing plate according to claim 1, wherein the photocurable adhesive has an adhesive strength of 500 to 2000 g/inch prior to photocuring and the degree of loss of adhesive ability after photocuring is not more than 50 g/inch.

19. The plate roll attached to a printing plate according to claim 1, wherein the adhesive is an acrylic adhesive which comprises trimethylolpropane (meth)acrylate.

* * * * *

UNITED STATES PATENT AND TRADEMARK OFFICE
CERTIFICATE OF CORRECTION

PATENT NO. : 5,284,091

DATED : February 8, 1994

INVENTOR(S) : Kazuhiro KON et al

It is certified that error appears in the above-identified patent and that said Letters Patent is hereby corrected as shown below:

Column 12, line 25 (Claim 4):

delete "the" and insert --a--.

Signed and Sealed this

Twenty-third Day of May, 1995

*Attest:*

BRUCE LEHMAN

*Attesting Officer*

*Commissioner of Patents and Trademarks*